US008344486B2

(12) United States Patent
Nakagawa et al.

(10) Patent No.: US 8,344,486 B2
(45) Date of Patent: Jan. 1, 2013

(54) SEMICONDUCTOR DEVICE AND DISPLAY APPARATUS

(75) Inventors: Tomokatsu Nakagawa, Osaka (JP); Yasunori Chikawa, Osaka (JP); Akiteru Rai, Osaka (JP); Tatsuya Katoh, Osakaa (JP); Takuya Sugiyama, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 12/737,431

(22) PCT Filed: Jul. 7, 2009

(86) PCT No.: PCT/JP2009/062389
§ 371 (c)(1),
(2), (4) Date: Jan. 31, 2011

(87) PCT Pub. No.: WO2010/007916
PCT Pub. Date: Jan. 21, 2010

(65) Prior Publication Data
US 2011/0108979 A1    May 12, 2011

(30) Foreign Application Priority Data

Jul. 16, 2008  (JP) ................................. 2008-184669

(51) Int. Cl.
*H01L 23/495* (2006.01)
(52) U.S. Cl. .................. 257/668; 257/E23.08; 257/717; 257/778; 361/760; 361/761; 362/631; 438/123
(58) Field of Classification Search ............. 257/E23.08, 257/668, 669, 706, 712, 713, 717, 720, 778–781, 257/784; 362/612, 622, 631, 783; 361/760–762, 361/ 764, 767; 438/123, 124
See application file for complete search history.

(56) References Cited

U.S. PATENT DOCUMENTS

| 5,289,039 | A | * | 2/1994 | Ishida et al. ................... 257/796 |
| 5,519,582 | A | * | 5/1996 | Matsuzaki ..................... 361/783 |
| 5,834,848 | A | * | 11/1998 | Iwasaki ......................... 257/778 |
| 5,901,041 | A | * | 5/1999 | Davies et al. ................. 361/704 |
| 5,923,084 | A | * | 7/1999 | Inoue et al. ................... 257/712 |

(Continued)

FOREIGN PATENT DOCUMENTS

JP    61-6848 A    1/1986
(Continued)

OTHER PUBLICATIONS

International Search Report.

*Primary Examiner* — Chris Chu
(74) *Attorney, Agent, or Firm* — Harness, Dickey & Pierce

(57) ABSTRACT

In a COF of an embodiment of the present invention, the smaller distance to edges of a heat-releasing member an area of the heat-releasing member has, the larger openings the area has. Accordingly, a volume per area (an area per length) of the heat-releasing member decreases toward the edges. The arrangement improves flexibility of the COF. This prevents a stress caused by bending the COF from concentrating at the edges. This makes it possible to prevent a line on an insulating film from being broken. Also, it becomes possible to prevent an anisotropic conductive resin from coming off which is used to bond the COF with a display panel in providing the COF in a display apparatus.

13 Claims, 6 Drawing Sheets

U.S. PATENT DOCUMENTS

| | | | |
|---|---|---|---|
| 5,942,795 A * | 8/1999 | Hoang | 257/692 |
| 6,037,656 A * | 3/2000 | Sugahara | 257/697 |
| 6,156,980 A * | 12/2000 | Peugh et al. | 174/252 |
| 6,226,183 B1 * | 5/2001 | Weber et al. | 361/704 |
| 6,282,094 B1 * | 8/2001 | Lo et al. | 361/704 |
| 6,525,942 B2 * | 2/2003 | Huang et al. | 361/704 |
| 6,542,374 B1 * | 4/2003 | Muramatsu et al. | 361/760 |
| 6,611,055 B1 * | 8/2003 | Hashemi | 257/706 |
| 6,960,824 B1 * | 11/2005 | Hashemi et al. | 257/698 |
| 7,176,579 B2 * | 2/2007 | Konishi et al. | 257/777 |
| 7,227,256 B2 * | 6/2007 | Zhao et al. | 257/707 |
| 7,253,503 B1 * | 8/2007 | Fusaro et al. | 257/668 |
| 7,259,457 B2 * | 8/2007 | Zhang et al. | 257/713 |
| 7,420,270 B2 * | 9/2008 | Lee et al. | 257/691 |
| 7,450,174 B2 * | 11/2008 | Watanabe et al. | 348/374 |
| 7,808,013 B2 * | 10/2010 | Mendendorp et al. | 257/99 |
| 2006/0071325 A1 | 4/2006 | Tanaka | |

FOREIGN PATENT DOCUMENTS

| | | |
|---|---|---|
| JP | 5-152353 A A | 6/1993 |
| JP | 2001-85475 A A | 3/2001 |
| JP | 2005-294639 A A | 10/2005 |
| JP | 2006-108356 A A | 4/2006 |

* cited by examiner

Prior Art

SEMICONDUCTOR DEVICE AND DISPLAY APPARATUS

TECHNICAL FIELD

The present invention relates to a semiconductor device which is a COF (Chip On Film) having a metallic heat-releasing member, and to a display apparatus having the semiconductor device. Particularly, the present invention relates to a semiconductor device which is improved in flexibility despite of the provision of the metallic heat-releasing member, and to a display apparatus having the semiconductor device.

BACKGROUND ART

A conventional technique disclosed as a countermeasure against heat release from a semiconductor of a COF is such that a metallic heat-releasing member is provided (i) in a position on one side of an insulating film of a COF which position corresponds to a position where a semiconductor device is provided on the other side of the insulating film, or (ii) entirely on the one side which is a side opposite to the other side of the insulating film of the COF on which other side the semiconductor element is provided. The following simply describes a COF based on the technique, with reference to (a) of FIG. 9.

As illustrated in (a) of FIG. 9, a COF 110 which is a COF based on the technique has an insulating film 101, a line 102 provided on one side of the insulating film 101, and a solder resist 103 provided so as to cover a part of the insulating film 101 and a part of the line 102. A bump electrode 104a provided to a semiconductor element 104 is joined to the line 102. The COF 110 further has: a sealing resin 106 which is provided around the semiconductor element 104 so as to fix the semiconductor element 104 to the insulating film 101 and so as to protect the semiconductor element 104 from the outside; and a heat-releasing member 107 (which specifically has a plate-like shape and is made from copper) provided on the other side (back side) of the insulating film 101 which is opposite to the one side of the insulating film 101. The provision of the heat-releasing member 107 to the COF 110 makes it possible to improve heat releasability of heat released from the semiconductor element 104.

Citation List

Patent Literature 1

Japanese Patent Application Publication, Tokukai, No. 2006-108356 A (Publication Date: Apr. 20, 2006)

Patent Literature 2

Japanese Patent Application Publication, Tokukai, No. 2005-294639 A (Publication Date: Oct. 20, 2005)

SUMMARY OF INVENTION

Technical Problem

The COF 110 is bent so as to be provided in, e.g., a display panel. In the provision, the heat-releasing member 107 hinders the COF 110 from being bent. Accordingly, a stress concentrates at an edge of the heat-releasing member 107 which edge corresponds to a boundary between an area of the COF 110 which area cannot be easily bent and an area thereof which can be easily bent. This causes a problem in that the line 102 is broken which is provided in the vicinity of the edge on the side opposite to the side on which the heat-releasing member 107 is provided. In addition, if the heat-releasing member 107 thus hinders the COF 110 from being bent, an anisotropic conductive resin used to bond the display panel with the COF 110 comes off due to a restoring force caused by bending the COF 110.

The present invention was made in view of the problems. An object of the present invention is to provide (i) a semiconductor device which is improved in its flexibility despite of the provision of a heat-releasing member so that a failure such as a break of a line is prevented, and (ii) a display apparatus having the semiconductor device.

Solution to Problem

In order to attain the object, a semiconductor device of the present invention includes: an insulating film; a line being provided on one side of the insulating film, the line having a terminal for external connection and a terminal for connection to a semiconductor element; and a heat-releasing member being provided on the other side of the insulating film, the semiconductor element being joined to the terminal for connection to a semiconductor element, a first area of the heat-releasing member which first area positionally corresponds to the semiconductor element and a vicinity thereof being greater in its volume per unit area than a second area of the heat-releasing member which second area positionally corresponds to a vicinity of an edge of the heat-releasing member, and the second area encompassing a third area adjacent to the first area and a fourth area adjacent to the third area and to the edge of the heat-releasing member, the third area being greater in its volume per unit area than the fourth area.

Further, in order to attain the object, a semiconductor device includes: an insulating film; a line being provided on one side of the insulating film, the line having a terminal for external connection and a terminal for connection to a semiconductor element; and a heat-releasing member being provided on the other side of the insulating film, the semiconductor element being joined to the terminal for connection to a semiconductor element, a first area of the heat-releasing member which first area positionally corresponds to the semiconductor element and a vicinity thereof being greater in its area per unit length than a second area of the heat-releasing member which second area positionally corresponds to a vicinity of an edge of the heat-releasing member, and the second area encompassing a third area adjacent to the first area and a fourth area adjacent to the third area and to the edge of the heat-releasing member, the third area being greater in its area per unit length than the fourth area.

Further, in order to attain the object, a display apparatus includes a display apparatus driving module for driving a display apparatus, the display apparatus driving module being provided in the display apparatus by provision of the semiconductor device.

According to the arrangement, the semiconductor device of the present invention is arranged such that a volume per unit area (area per unit length) of the heat-releasing member decreases toward the edges. The arrangement makes it possible to improve the flexibility of the semiconductor device. This makes it possible to prevent the stress caused by bending the semiconductor device from concentrating at the edges of the heat-releasing member. As a result, it becomes possible to protect the line on the insulating film from being broken. Further, the improvement of the flexibility of the semiconductor device makes it possible to prevent the anisotropic conductive resin from coming off which is used to bond the semiconductor device with the display panel in providing the semiconductor device in the display panel.

Further, the semiconductor device is arranged such that the area which positionally corresponds to the semiconductor element and the vicinity thereof secures a volume (area) of the heat-releasing member. This makes it possible to retain the original function of the heat-releasing member (i.e., heat release from the semiconductor element), while improving the flexibility.

Further, according to the arrangement, the display apparatus of the present invention includes the display apparatus driving module for driving a display apparatus, by the provision of the semiconductor device above or below which has a heat-releasing function and is improved in its flexibility so that a failure such as a break of a line is prevented. This makes it possible to secure a high reliability of operation of the display apparatus.

Thus, the semiconductor device makes it possible to provide (i) a semiconductor device which is improved in its flexibility despite of the provision of the heat-releasing member so that a failure such as a break of a line is prevented, and (ii) a display apparatus having the semiconductor device.

The semiconductor device of the present invention is preferably arranged such that: the second area has a plurality of openings which penetrate the heat-releasing member so as to reach the insulating film; the plurality of openings include a plurality of first openings and a plurality of second openings; each of the plurality of first openings is smaller in its area than each of the plurality of second openings; the plurality of first openings are provided in the third area; and the plurality of second openings are provided in the fourth area.

According to the arrangement, the openings closer to the edges of the heat-releasing member have a larger area so that an area per length of the heat-releasing member decreases toward the edges. The arrangement makes it possible to improve the flexibility of the semiconductor device so that various effects such as prevention of a break of the line.

The semiconductor device of the present invention is preferably arranged such that: the second area has a plurality of openings which penetrate the heat-releasing member so as to reach the insulating film; the plurality of openings include a plurality of first openings; and the number of the plurality of first openings is greater in the fourth area than in the third area.

According to the arrangement, the area closer to the edges of the heat-releasing member has more openings so that an area per length of the heat-releasing member decreases toward the edges. The arrangement makes it possible to improve the flexibility of the semiconductor device so that various effects such as prevention of a break of the line.

The semiconductor device of the present invention is preferably arranged such that each of the plurality of openings has no angle of not more than 90°.

Further, the semiconductor device of the present invention is preferably arranged such that each of the plurality of openings has a circular shape or a polygonal shape having more than five angles. The polygon with more than five angles encompasses, e.g., a hexagon, and refers to a polygon having more than five line segments.

If each of the openings has a shape with an angle of not more than 90°, a stress concentrates at the angle so that each of the openings can be bent and cracked from the angle. The aforementioned arrangement of the present invention makes it possible to alleviate the concentration of the stress at the angle. This makes it possible to prevent the heat-releasing member from being bent and cracked. It is particularly preferable that each of the openings has a circular shape.

The semiconductor device of the present invention is preferably arranged such that the second area has a plurality of cutouts so that an area per unit length of the heat-releasing member in the second area decreases toward the edge of the heat-releasing member.

According to the arrangement, the plurality of cutouts are provided to the heat-releasing member so that an area per length of the heat-releasing member in the second area decreases toward the edges of the heat-releasing member. The arrangement makes it possible to improve the flexibility of the semiconductor device so that various effects such as prevention of a break of the line. In addition, according to the arrangement, an area per length of the heat-releasing member decreases continuously toward the edges of the heat-releasing member. As compared to the arrangement in which the openings are provided, this makes it possible to further prevent the stress caused by bending the semiconductor device from concentrating at the edges, and to thereby realize the various effects such as the prevention of a break of the line more remarkably.

The semiconductor device of the present invention is preferably arranged such that the plurality of cutouts are provided in the second area except its part corresponding to a central part of the edge of the heat-releasing member.

The semiconductor device of the present invention is preferably arranged such that the plurality of cutouts are provided in a part of the second area which part corresponds to a central part of the edge of the heat-releasing member.

According to the arrangement, the plurality of cutouts are provided to the heat-releasing member except its area corresponding to the central part of the edge, or provided in the area corresponding to the central part of the edge so that the area of the heat-releasing member is reduced. The arrangement makes it possible to improve the flexibility of the semiconductor device so that various effects such as prevention of a break of the line.

The arrangement also realizes the following effect. In a stage of product shipment, the semiconductor device is such that a resin is provided around the semiconductor element so as to fix the semiconductor element to the insulating film and so as to protect the semiconductor element from external water etc. The resin shrinks due to heat which is applied thereto when the semiconductor device is provided in a display apparatus. This can cause warpage of the semiconductor device. The warpage can also be caused by a mismatch between thermal expansion of the heat-releasing member and that of the insulating film. In a case where the semiconductor device having the warpage is provided in the display apparatus, a stress due to the warpage concentrates at the edges of the heat-releasing member. This leads to such a problem that the anisotropic conductive resin comes off which is used to bond the display panel with the semiconductor device. The aforementioned arrangement of the present invention makes it possible to alleviate the concentration of the stress at the edges. As a result, it becomes possible to prevent the anisotropic conductive resin from coming off.

Where to provide the cutouts is preferably varied depending on a direction in which the semiconductor device has the warpage and a direction in which the semiconductor device is bent. Specifically, it is preferably arranged such that for protruding warpage at the central parts, the cutouts are provided only to the central parts, and for depressing warpage at the central parts, the cutouts are provided to the edges except their central parts.

The semiconductor device is preferably arranged such that the heat-releasing member has a slit.

According to the arrangement, the provision of the slit to the heat-releasing member makes it possible to hinder the thermal expansion of the heat-releasing member so that the thermal expansion is alleviated. As a result, it becomes possible to prevent deformation or a break of a line, which is caused by the thermal expansion. In a case where, e.g., the heat-releasing member has a rectangular shape, the slit is provided in the longer side direction of the heat-releasing member, from a functional standpoint.

Advantageous Effects of Invention

A semiconductor device of the present invention includes: an insulating film; a line being provided on one side of the insulating film, the line having a terminal for external connection and a terminal for connection to a semiconductor element; and a heat-releasing member being provided on the other side of the insulating film, the semiconductor element being joined to the terminal for connection to a semiconductor element, a first area of the heat-releasing member which first area positionally corresponds to the semiconductor element and a vicinity thereof being greater in its volume per unit area than a second area of the heat-releasing member which second area positionally corresponds to a vicinity of an edge of the heat-releasing member, and the second area encompassing a third area adjacent to the first area and a fourth area adjacent to the third area and to the edge of the heat-releasing member, the third area being greater in its volume per unit area than the fourth area.

Further, a semiconductor device includes: an insulating film; a line being provided on one side of the insulating film, the line having a terminal for external connection and a terminal for connection to a semiconductor element; and a heat-releasing member being provided on the other side of the insulating film, the semiconductor element being joined to the terminal for connection to a semiconductor element, a first area of the heat-releasing member which first area positionally corresponds to the semiconductor element and a vicinity thereof being greater in its area per unit length than a second area of the heat-releasing member which second area positionally corresponds to a vicinity of an edge of the heat-releasing member, and the second area encompassing a third area adjacent to the first area and a fourth area adjacent to the third area and to the edge of the heat-releasing member, the third area being greater in its area per unit length than the fourth area.

Further, in order to attain the object, a display apparatus of the present invention includes a display apparatus driving module for driving a display apparatus, the display apparatus driving module being provided in the display apparatus by provision of the semiconductor device.

According to the arrangement, the semiconductor device of the present invention is arranged such that a volume per unit area (area per unit length) of the heat-releasing member decreases toward the edges. The arrangement makes it possible to improve the flexibility of the semiconductor device. This makes it possible to prevent the stress caused by bending the semiconductor device from concentrating at the edges of the heat-releasing member. As a result, it becomes possible to protect the line on the insulating film from being broken. Further, the improvement of the flexibility of the semiconductor device makes it possible to prevent the anisotropic conductive resin from coming off which is used to bond the semiconductor device with the display panel in providing the semiconductor device in the display panel.

Further, the semiconductor device is arranged such that the area which positionally corresponds to the semiconductor element and the vicinity thereof secures a volume (area) of the heat-releasing member. This makes it possible to retain the original function of the heat-releasing member (i.e., heat release from the semiconductor element), while improving the flexibility.

Further, according to the arrangement, the display apparatus of the present invention includes the display apparatus driving module for driving a display apparatus, by the provision of the semiconductor device above or below which has a heat-releasing function and is improved in its flexibility so that a failure such as a break of a line is prevented. This makes it possible, to secure a high reliability of operation of the display apparatus.

Thus, the semiconductor device makes it possible to provide (i) a semiconductor device which is improved in its flexibility despite of the provision of the heat-releasing member so that a failure such as a break of a line is prevented, and (ii) a display apparatus having the semiconductor device.

For a fuller understanding of the nature and advantages of the invention, reference should be made to the ensuing detailed description taken in conjunction with the accompanying drawings.

BRIEF DESCRIPTION OF DRAWINGS

FIG. 6 is a plan view illustrating one example of the provision of cutouts.

FIG. 7 is a plan view illustrating another example of the provision of cutouts.

DESCRIPTION OF EMBODIMENTS

In the present Description, a direction along a longer side of a rectangular member of a semiconductor device of the present invention is expressed as "horizontal direction" or "horizontally" and a direction along a shorter side of the rectangular member is expressed as "vertical direction" or "vertically."

[Embodiment 1]

The following describes one embodiment of the present invention, with reference to FIGS. 1 to 7.

Figure 1:
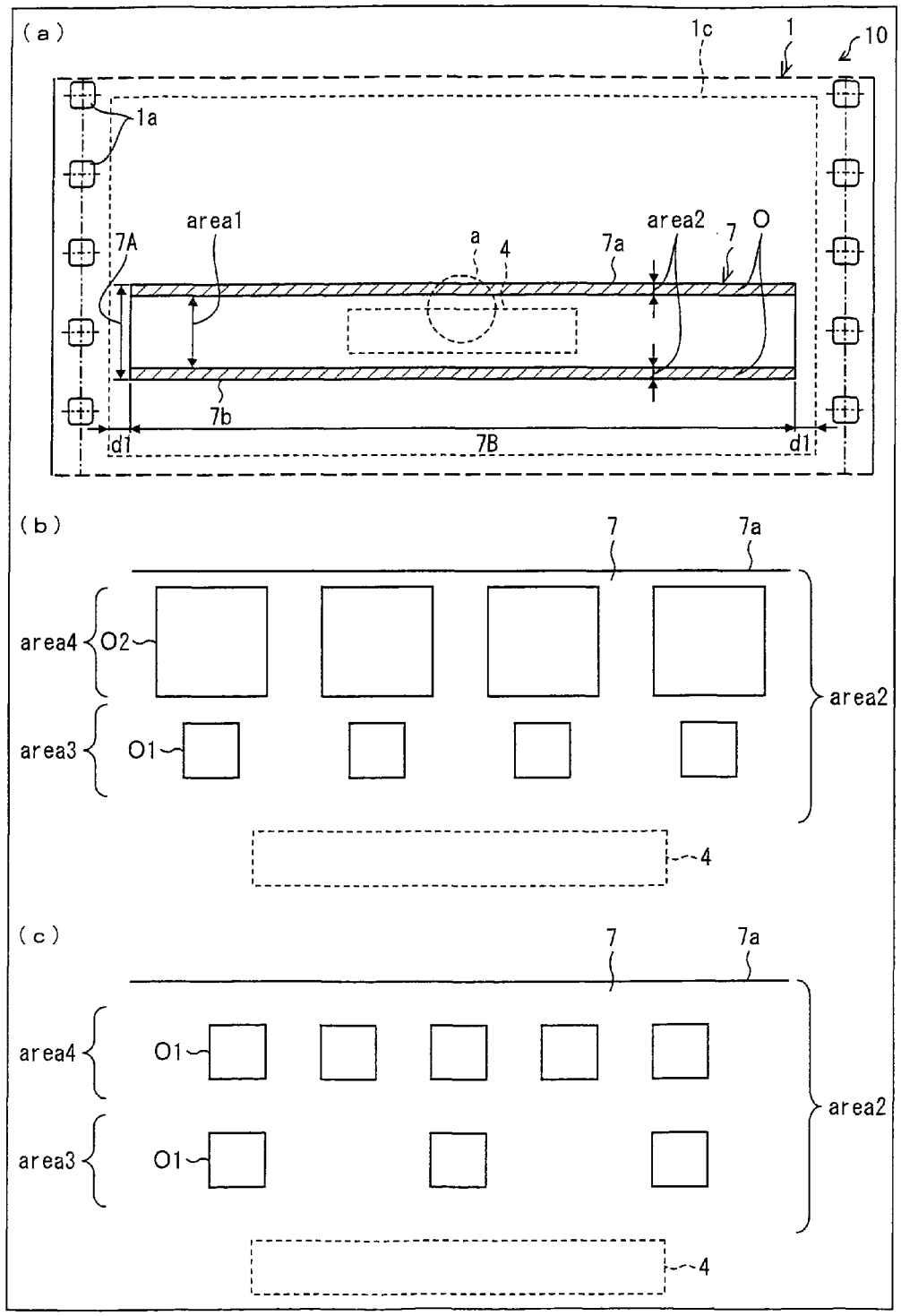
FIG. 1 illustrates a COF of one embodiment of the present invention. (a) of FIG. 1 is a plan view illustrating a back side of the COF. (b) and (c) of FIG. 1 are enlarged views illustrating an area indicated with "a" in (a) of FIG. 1.

FIG. 1 illustrates a COF (semiconductor device) 10 of the present embodiment. (a) of FIG. 1 illustrates a back side of the COF 10. Each of (b) and (c) of FIG. 1 is an enlarged view of an arrangement example of a region indicated with "a" in (a) of FIG. 1.

Figure 5:
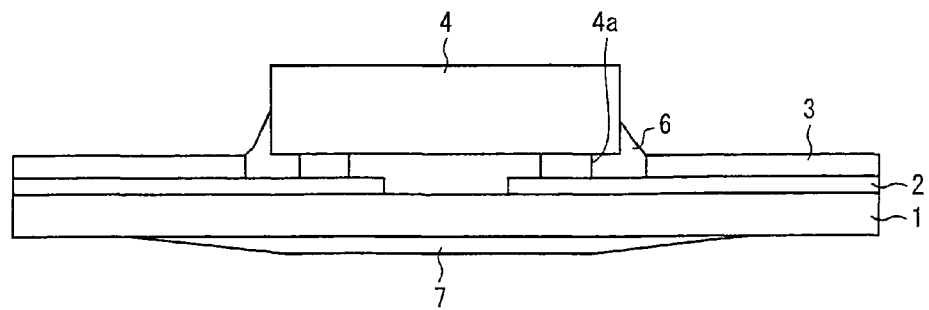
FIG. 5 is a view illustrating an arrangement example of the heat-releasing member of the COF of FIG. 1.
Figure 9:
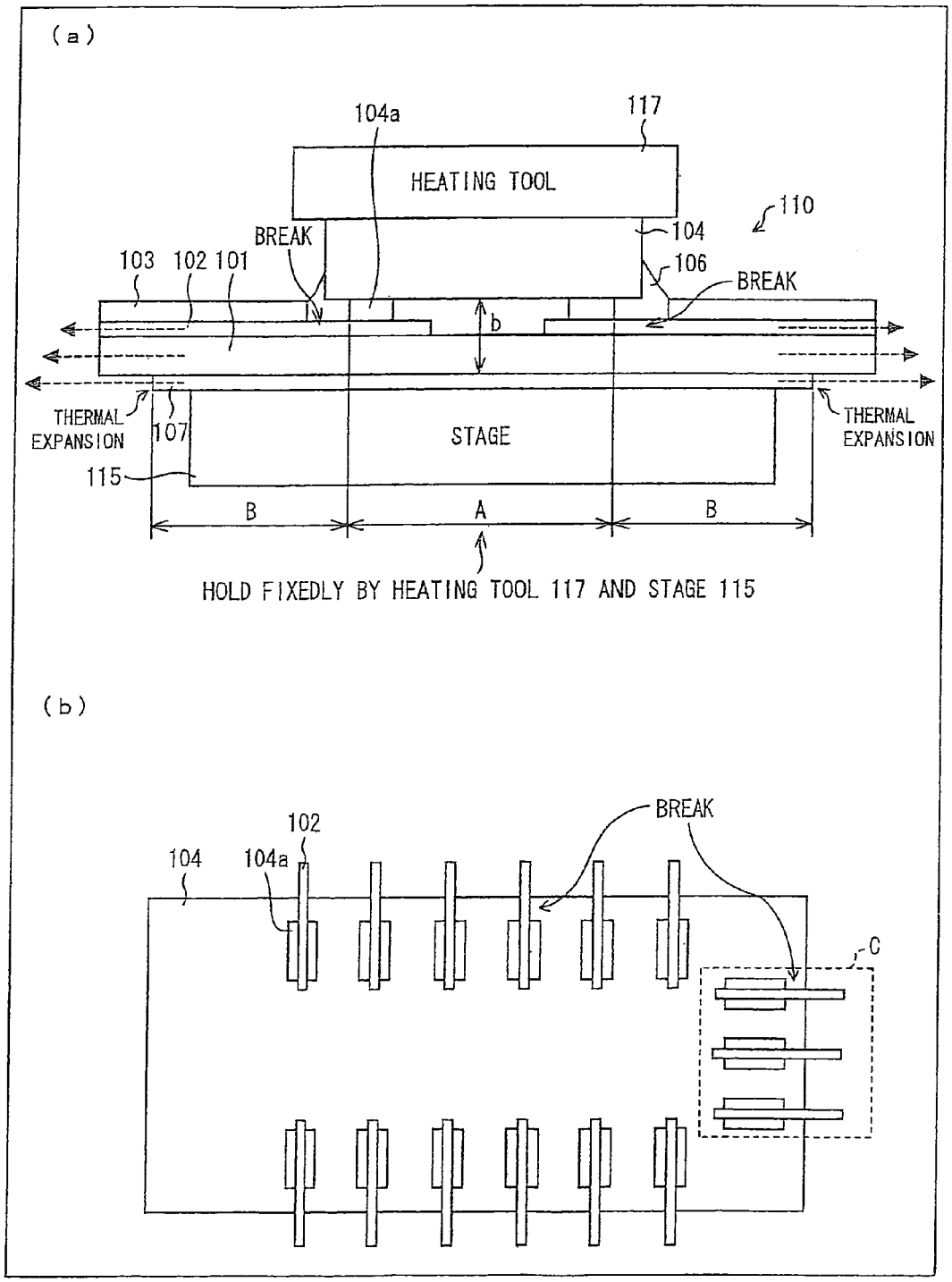
FIG. 9 illustrates a COF according to a conventional art. (a) of FIG. 9 is a cross-sectional view thereof. (b) of FIG. 9 is a plan view illustrating a surface of a semiconductor element on which bump electrodes are provided.

As illustrated in FIG. 5, the COF 10 has a similar arrangement to the COF 110 in (a) of FIG. 9. The COF 10 includes: an insulating film 1 having sprocket holes 1a which are used in carrying a semiconductor element etc.; a line 2 provided on one side of the insulating film 1 which line 2 has a terminal (not illustrated) for external connection and a terminal (not illustrated) for connection to a semiconductor element; and a solder resist 3 provided so as to cover a part of the insulating film 1 and a part of the line 2. In the COF 10, a semiconductor element 4 having a bump electrode 4a is joined, via the bump electrode 4a, to the terminal of the line 2 for connection to a semiconductor element. The COF 110 further includes: a sealing resin 6 which is provided around the semiconductor element 4 so as to fix the semiconductor element 4 to the insulating film 1 and so as to protect the semiconductor element 4 from external water etc.; and a heat-releasing member 7 provided on the other side (back side) of the insulating film 1 which is opposite to the one side of the insulating film 1. The provision of the heat-releasing member 7 to the COF 10 makes it possible to improve heat releasability of heat released from the semiconductor element 4.

Figure 2:
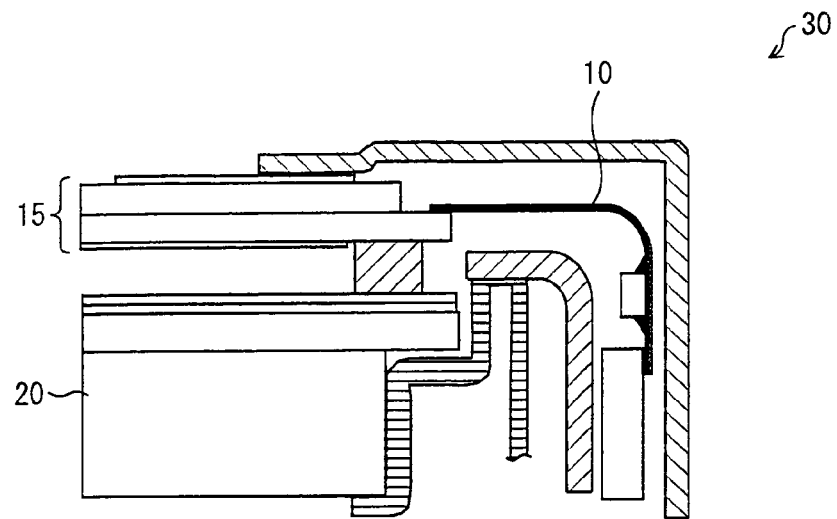
FIG. 2 is a view illustrating an arrangement of a part of a display apparatus having the COF of FIG. 1.

FIG. 2 illustrates an arrangement of a part of a display apparatus 30 having the COF 10. Since the display apparatus 30 is a common liquid crystal display apparatus, detailed explanation thereof is omitted.

The display apparatus 30 includes a display panel 15, a backlight device 20, and the COF 10 which serves as a display apparatus driving module for displaying an image on the display panel 15 (i.e., COF 10 for providing the display apparatus driving module to the display apparatus 30). As illustrated in FIG. 2, the COF 10 is bent so as to be provided in the display apparatus 30. The COF 10 is, e.g., improved in its flexibility despite the provision of the heat-releasing member 7. This makes it possible to prevent the line 2 from being broken. Details of this are described later. The display apparatus driving module is provided to the display apparatus 30 by providing the COF 10 having the effect. This makes it possible to secure a high reliability of operation of the display apparatus 30. Particularly, in a case where the display panel 15 is a large panel which is a multifunctional multiple-output display panel, it is possible to remarkably obtain the high reliability. The display apparatus 30 is not limited to a liquid crystal display apparatus but may be, e.g., a display apparatus utilizing organic EL.

The following describes details of the COF 10. The insulating film 1, the line 2, the solder resist 3, and the sealing resin 6 are formed from conventional materials and by conventional methods. Therefore, the following omits the explanations of these members, and mainly describes the heat-releasing member 7.

The heat-releasing member 7 preferably has a plate-like shape. For a high heat releasability, the heat-releasing member 7 is made from a material having a high thermal conductivity. Specifically, the heat-releasing member 7 is preferably made from a material having a thermal conductivity of not lower than 10 W/(m K). In other words, the heat-releasing member 7 is preferably made from copper, aluminum, or SUS (stainless steel). A method for forming the heat-releasing member 7 is common sputtering or the like. The present embodiment adopts copper. A surface of the heat-releasing member 7 is preferably plated or coated with a material other than the material for the heat-releasing member 7. Since the heat-releasing member 7 is thus made usually from a metallic material, the heat-releasing member 7 can be oxidized. However, the arrangement makes it possible to prevent the heat-releasing member 7 from being oxidized. Specifically, the heat-releasing member 7 is plated with tin or coated with a solder resist.

Figure 3:
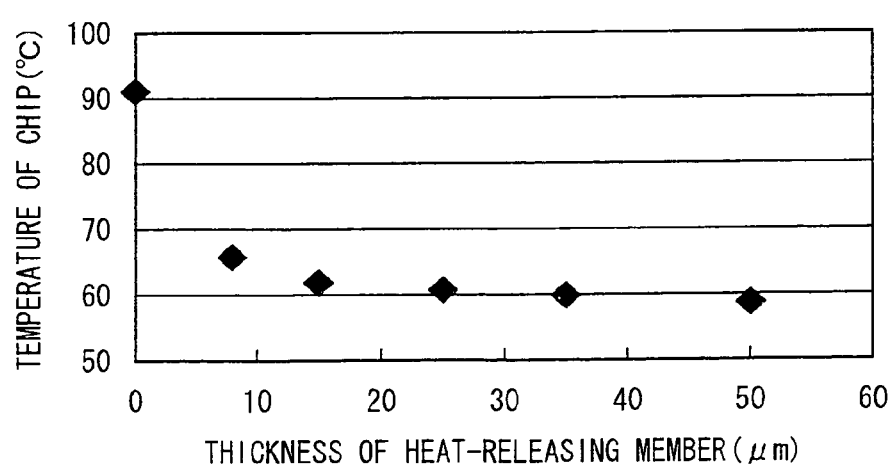
FIG. 3 is a graph showing relationships between a thickness of a heat-releasing member and a temperature of the COF of FIG. 1 having the heat-releasing member.
Figure 4:
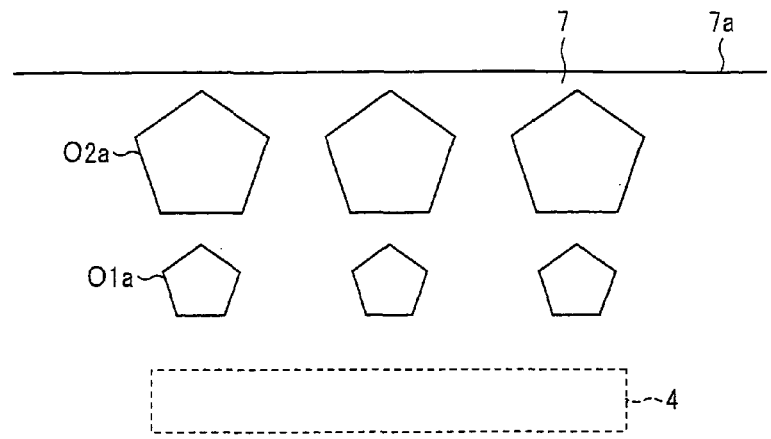
FIG. 4 is a plan view illustrating an example of a shape of openings provided to the heat-releasing member of the COF of FIG. 1.

The heat-releasing member 7 preferably has a thickness from 5 μm to 30 μm, or more preferably, a thickness from 8 μm to 15 μm. FIG. 3 is a graph showing relationship between a thickness of the heat-releasing member 7 and a temperature of the COF 10. The graph clearly shows that the COF 10 has the most significant temperature drop in a case where the heat-releasing member 7 has a thickness from 8 μm to 15 μm, and a greater thickness does not contribute to the effect. The heat-releasing member 7 is preferably thinner for keeping the thinness of the COF 10. Therefore, the heat-releasing member 7 preferably has a thickness from 8 μm to 15 μm. The arrangement makes it possible to improve heat releasability while keeping the COF 10 thin. The present embodiment adopts a thickness of 8 μm or 15 μm.

For thinness of the COF 10 and a high heat releasability, a vertical distance (i.e., distance "b" in (a) of FIG. 9) between the semiconductor element 4 and the heat-releasing member 7 is preferably not more than 0.1 mm.

The heat-releasing member 7 is preferably provided on the entire back side of the COF 10. The arrangement makes it possible to achieve a high heat releasability. However, as described above, the COF 10 is bent so as to be provided in the display apparatus 30. Therefore, in view of the flexibility of the COF 10, the heat-releasing member 7 is preferably provided on a part of the back side of the COF 10, specifically, in a position on the back side which position corresponds to the semiconductor element 4 and the vicinity thereof.

A punching area of a COF is punched when the COF is provided in a device. Accordingly, a width 7B of the heat-releasing member 7 is determined so that margins (i.e., regions indicated with "d1" in (a) of FIG. 1) of not less than 0.5 mm from both sides of a punching area 1c are left. In the present embodiment, d1 is set to 1 mm. The arrangement makes it possible to improve the heat releasability, without causing any problem in the punching.

In the present embodiment, the heat-releasing member 7 has a rectangular shape in accordance with the rectangular shape of the semiconductor element 4. However, a shape of the heat-releasing member 7 is not limited to this, but may be, e.g., a square.

As the most remarkable point of the present embodiment, the heat-releasing member 7 has an area 1 (first area) positionally corresponding to the semiconductor element 4 and the vicinity thereof, and a pair of areas 2 (second areas) sandwiching the area 1 which areas 2 correspond to vicinities of edges 7a and 7b which are horizontal edges of the heat-releasing member 7. Each of the areas 2 has an area 3 (third area) which is zonally extended in the horizontal direction beside the area 1, and an area 4 (fourth area) which is zonally extended in the horizontal direction beside the area 3 on its outer side with respect to the area 1. The area 3 has a plurality of openings O1 which are provided at predetermined intervals in the horizontal direction. The area 4 has a plurality of openings O2 which are provided at predetermined intervals in the horizontal direction in positions corresponding to the openings O1.

The plurality of openings O1 and O2 are collectively referred to as openings O. As illustrated in (b) of FIG. 1, the openings O1 and O2 have square shapes, and the openings O2 have a larger area than the openings O1. The openings O1 are provided in the area 3 in the area 2. The openings O2 are provided in the area 4 in the area 2. That is, the heat-releasing member 7 is smaller in volume (area) than a heat-releasing member having no opening for the reason that the openings O are provided. In addition, the smaller distance to the edges 7a and 7b an opening O has, the larger area the opening O has. Therefore, a volume per unit area (area per unit length) of the heat-releasing member 7 decreases toward the edges 7a and 7b, in order of the area 1, the area 2, the area 3, and the area 4.

The heat-releasing member 7 thus arranged shows an improved flexibility when the COF 10 is bent. This prevents a stress caused by bending the COF 10 from concentrating at the edges 7a and 7b of the heat-releasing member 7. This makes it possible to prevent the line 2 on the insulating film 1 from being broken. Further, the improvement of the flexibility of the COF makes it possible to prevent an anisotropic conductive resin from coming off which is used to bond the COF 10 with the display panel 15 in providing the COF 10 in the display apparatus 30.

Further, the COF 10 is arranged such that in the area 1 which positionally corresponds to the semiconductor element 4 and the vicinity thereof, no opening O is provided so that the volume (area) of the heat-releasing member 7 is secured. This makes it possible to retain an original function (i.e., heat release from the semiconductor element 4) of the heat-releasing member 7, while improving the flexibility. In other words, the openings O are provided in positions which do not contribute very much to the heat release which is the function of the heat-releasing member 7. Specifically, the areas 2 have a width from approximately 1 to 3 (mm) from the edges 7a and 7b toward the vicinity of the semiconductor element 4.

As illustrated in (c) of FIG. 1, it may be arranged such that the openings O are constituted only by the openings O1, and more openings O1 are provided in the area 4 than in the area 3 so that the function of the openings O2 is realized. The arrangement makes it possible to produce the same effect as the arrangement in which both openings O1 and O2 are provided.

Each of the openings O preferably has a shape without an angle of not more than 90°. This is because if each of the openings O has a shape with an angle of not more than 90°, a stress concentrates at the angle so that each of the openings O can be bent and cracked from the angle. The shape without an angle of not more than 90° encompasses, e.g., a pentagon such as those illustrated in FIG. 4, a polygon with more than five angles, or a circle, which circle is particularly preferable. The polygon with more than five angles encompasses, e.g., a hexagon, and refers to a polygon having more than five line segments.

Figure 6:
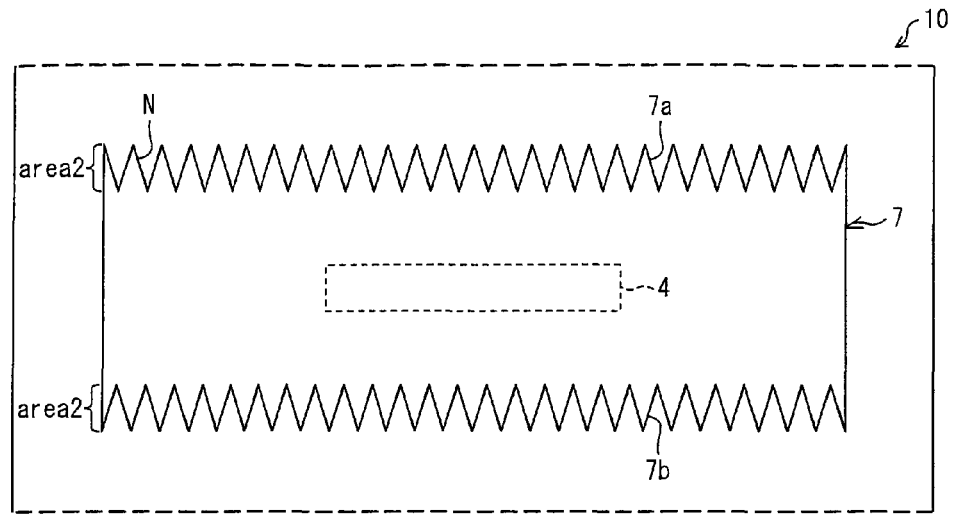
FIG. 6 is a plan view illustrating an arrangement example of the heat-releasing member of the COF of FIG. 1. Specifically.
Figure 7:
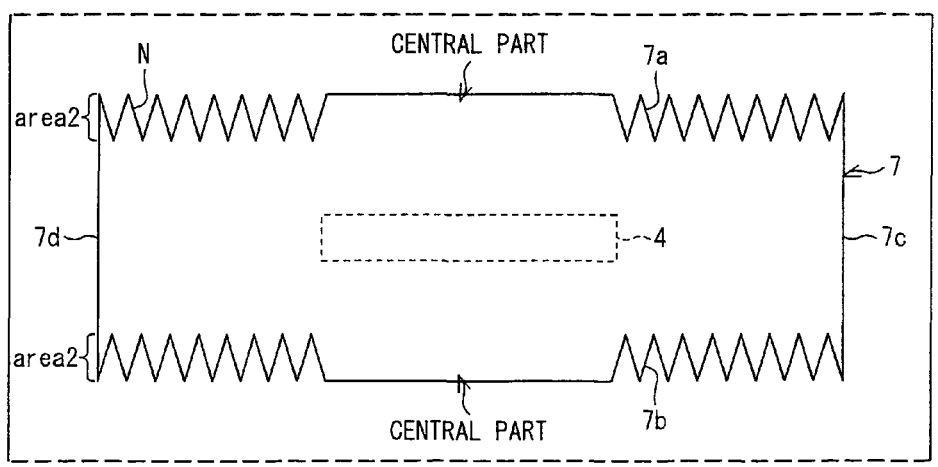
FIG. 7 is a plan view illustrating an arrangement example of the heat-releasing member of the COF of FIG. 1. Specifically.

As illustrated in FIG. 5, in order that the flexibility of the COF 10 is improved for various effects such as prevention of a break of the line 2, a thickness of the heat-releasing member 7 may be decreased in a stepwise or continuous manner toward the edges 7a and 7b, instead of the provision of the openings O. Alternatively, as illustrated in FIGS. 6 and 7, a plurality of cutouts N may be provided to the heat-releasing member 7 so that areas per length of the heat-releasing members 7 in the areas 2 are decreased toward the edges 7a and 7b. Each of FIGS. 6 and 7 illustrates the heat-releasing member 7 having the cutouts N, except for other members of the COF 10.

By thus reducing a thickness of the heat-releasing member 7 toward the edges 7a and 7b thereof, or by thus providing the cutouts N so that an area per length in the area 2 of the heat-releasing member 7 is decreased toward the edges 7a and 7b, the heat-releasing member 7 decreases in a stepwise or continuous manner toward the edges 7a and 7b. As compared to the arrangement in which the openings O are provided, this makes it possible to further prevent the stress caused by bending the COF 10 from concentrating at the edges 7a and 7b, and to thereby realize the various effects such as the prevention of a break of the line 2 more remarkably.

In a case where the cutouts N are provided as illustrated in FIG. 7, i.e., in a case where the cutouts N are provided to the edges 7a and 7b except their central parts, or provided only to the central parts, the following effect can be realized, in addition to the aforementioned various effects.

As described above, the COF 10 is arranged such that the sealing resin 6 is provided around the semiconductor element 4 so as to fix the semiconductor element 4 to the insulating film 1 and so as to protect the semiconductor element 4 from external water etc. The sealing resin 6 shrinks due to heat which is applied thereto when the COF 10 is provided in the display apparatus 30. This can cause warpage of the COF 10 (i.e., warpage along the horizontal direction of the heat-releasing member 7). The warpage can also be caused by a mismatch between thermal expansion of the heat-releasing member 7 and that of the insulating film 1. In a case where the COF 10 having the warpage is provided in, e.g., a display panel as described above, the stress due to the warpage concentrates at the edges 7a and 7b. This leads to such a problem that the anisotropic conductive resin comes off which is used to bond the display panel with the COF 10. In view of this, the cutouts N are provided to the edges 7a and 7b except their central parts, or provided only to the central parts. This alleviates the concentration of the stress at the edges 7a and 7b. As a result, it becomes possible to prevent the anisotropic conductive resin from coming off. The problem of the warpage can also be solved by an arrangement such that an area per length of the heat-releasing member 7 decreases from the central parts of the edges 7a and 7b toward the edges 7c and 7d which are vertical edges of the heat-releasing member 7 (by a shape such as a rhombus, in an extreme case).

Where to provide the cutouts N is preferably varied depending on a direction in which the COF 10 has the warpage and a direction in which the COF 10 is bent. Specifically, it is preferably arranged such that for protruding warpage at the central parts, the cutouts N are provided only to the central parts, and for depressing warpage at the central parts, the cutouts N are provided to the edges 7a and 7b except their central parts.

As described above, the COF 10 of the present embodiment is arranged such that a volume per unit area (area per unit length) of the heat-releasing member 7 decreases toward the edges 7a and 7b thereof. The arrangement makes it possible to improve the flexibility of the COF 10. This makes it possible to prevent the stress caused by bending the COF 10 from concentrating at the edges 7a and 7b of the heat-releasing member 7. As a result, it becomes possible to protect the line 2 on the insulating film 1 from being broken. Further, the improvement of the flexibility of the COF 10 makes it possible to prevent the anisotropic conductive resin from coming off which is used to bond the COF 10 with the display panel 15 in providing the COF 10 in the display apparatus 30. Further, the area 1 which positionally corresponds to the semiconductor element 4 and the vicinity thereof has no opening O so that a volume (area) of the heat-releasing member 7 is secured. This makes it possible to retain the original function of the heat-releasing member 7 (i.e., heat release from the semiconductor element 4), while improving the flexibility.

Patent Literature 2 discloses that: a dummy pattern is provided on a flexible substrate constituting a flex-rigid wiring board so that a degree of a flection of the flexible substrate is increased and a break etc. of a conductor circuit is prevented; and openings having various shapes are provided to the dummy pattern. Specifically, openings having the same area are provided to the dummy pattern in a lattice pattern, or openings having a larger area are provided to a central part of the dummy pattern and openings having a smaller area are provided on an edge side with respect to the former openings.

Thus, the openings provided to the dummy pattern are not arranged such that the smaller distance to an edge an opening has, the larger area the opening has, unlike the present invention. Therefore, at least in this regard, the invention disclosed in Patent Literature 2 is different from the present invention (see Patent Literature 2, paragraphs [0042] to [0049], and FIG. 3).

[Embodiment 2]

Figure 8:
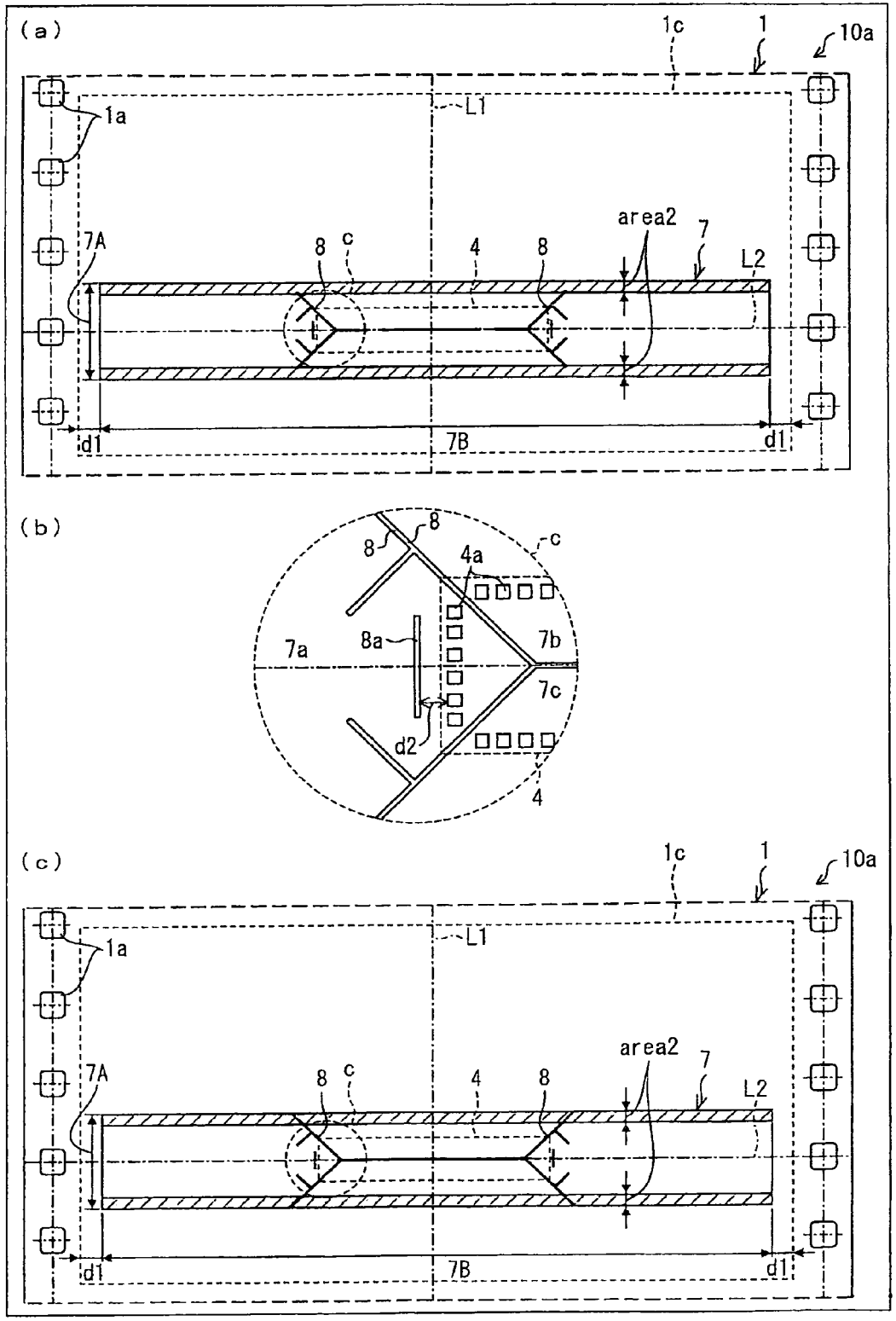
FIG. 8 illustrates a COF of another embodiment of the present invention. (a) and (c) of FIG. 8 are plan views illustrating a back side of the COF. (b) of FIG. 8 is an enlarged view illustrating an area indicated with "c" in (a) and (c) of FIG. 8.

The following describes another embodiment of the present invention, with reference to FIG. 8.

FIG. 8 illustrates a COF 10a of the present embodiment. (a) and (c) of FIG. 8 illustrate a back side of the COF 10a. (b) of FIG. 8 is an enlarged view of a region indicated with "c" in (a) and (c) of FIG. 8. For convenience of explanation, members having the same functions as the members of COF 10 are given common reference signs, and descriptions of such members are not repeated below. In addition, basically, the following only describes differences between the COF 10a and the COF 10.

The COF 10a has the same arrangement as the COF 10 except that slits 8 illustrated in FIG. 8 are further provided to the heat-releasing member 7. The following describes the slits 8 in detail.

As illustrated in (a) of FIG. 9, in bonding the bump electrode 104a of the semiconductor element 104 with the line 102, the conventional COF 110 is placed on a stage 115 heated to approximately 120° C., and on the other hand, a heating tool 117 heated to approximately 400° C. is placed on the semiconductor element 104 so that a pressure is applied on the semiconductor element 104. This state is maintained for approximately one second so that the bump electrode 104a is bonded with the line 2 by thermocompression bonding.

In this state, the heat-releasing member 107 in the range indicated with "A" in (a) of FIG. 9 is fixedly held by the stage 115 and the heating tool 117. In contrast, the heat-releasing member 107 in the range indicated with "B" in (a) of FIG. 9 is not fixedly held by them. As a result, the heat-releasing member 107 in the latter area is extended in a longer side direction (i.e., direction indicated with arrows with dashed lines in (a) of FIG. 9) due to thermal expansion caused by heat of the stage 115 and the heating tool 117. The phenomenon is considered to occur similarly in a heating process such as a process of curing resin which is carried out after resin sealing. The phenomenon causes a problem in that the insulating film 101 is also extended with the extension of the heat-releasing member 107 so that deformation or a break of the line 102 is caused. (b) of FIG. 9 is a plan view illustrating a surface of the semiconductor element 104 on which surface the bump electrode 104a is provided. As described above, the heat-releasing member 107 and the insulating film 101 are extended in their longer side directions. Therefore, deformation or a beak of the line 2 is notable in the vicinity of a shorter side of the semiconductor element 104 (i.e., in an area indicated with "C" in (b) of FIG. 9).

The slits 8 are members for solving this problem. The slits 8 make it possible to alleviate the thermal expansion, which is caused by a heating process such as a process of curing resin which is carried out after resin sealing and thermocompression bonding which is carried out in bonding the bump electrode 104a of the semiconductor element 4 with the line 2, so as to prevent the extension of the heat-releasing member 7, without impairing the heat-releasing function of the heat-releasing member 7. This prevents deformation or a break of the line 2.

Basically, the slits 8 are preferably provided to the heat-releasing member 7 in a position corresponding to the semiconductor element 4 and the vicinity thereof, in view of their function (i.e., provided in the area 1). In addition, the slits 8 are preferably provided axisymmetrically with respect to, e.g., center lines L1 and L2 of the semiconductor element 4. According to the arrangement, the slits 8 are evenly provided in a position corresponding to the semiconductor element 4 and the vicinity thereof. This makes it possible to surely alleviate the thermal expansion. This makes it possible to surely prevent deformation or a break of the line 2. In addition, it is preferably arranged such that a first slit is provided so as to be parallel with one side of the semiconductor element 4, and a horizontal distance is not less than 0.1 mm and not more than 2.0 mm between the first slit and an edge surface of a bump electrode 4a located along one side of the semiconductor element 4 which one side is closest to the first slit. According to the arrangement, the first slit is provided so as to intersect with a path on which the heat-releasing member 7 is thermally expanded. This is very effective for the alleviation of the thermal expansion. This makes it possible to alleviate the thermal expansion more surely. As a result, it becomes possible to prevent deformation or a break of the line 2 more surely.

The slits 8 illustrated in FIG. 8 are formed for a case where the heat-releasing member 7 is extended particularly in the longer side direction due to heating processes such as a process of curing resin and a process of thermocompression bonding. Therefore, many slits 8 are radially provided particularly in the vicinity of the shorter sides of the semiconductor element 4. As illustrated in (b) of FIG. 8, more specifically, the slits 8 are provided to the heat-releasing member 7 so that areas 7a, 7b, 7c, and 7d (not illustrated) are defined on the heat-releasing member 7, and each of the areas encompasses bump electrodes 4a along corresponding one side of the semiconductor element 4 (for example, the area "7a" encompasses bump electrodes 4a along a corresponding shorter side of the semiconductor element 4).

The slits 8 illustrated in FIG. 8 include a slit 8a (see (b) of FIG. 8) as the first slit. A horizontal distance ("d2" in (b) of FIG. 8) is 0.5 mm between the slit 8a and an edge surface of the bump electrodes 4a located along one side of the semiconductor element 4 which one side is closest to the first slit. In view of the heat releasability, the slit 8a illustrated in (b) of FIG. 8 may be formed so as not to separate the heat-releasing member 7. Alternatively, as illustrated in (c) of FIG. 8, the slit 8a may be formed so as to separate the heat-releasing member 7.

Each of the slits 8 preferably has a width from 0.02 mm to 1.0 mm. The arrangement makes it possible to realize a small size of the slits 8 so that the heat releasability of the heat-releasing member 7 is not impaired. As a result, it becomes possible to prevent deformation or a break of the line 2. In the present embodiment, the slits 8 have a width of 0.05 mm. The slits 8 are formed by a method of common etching.

The position and shape of the slits 8 are merely one example. The extension of the heat-releasing member 7 is caused by the reason that the heat-releasing member 7 cannot be partially fixed due to differences in shape and size between the device (i.e., the stage 115 and heating tool 117 in (a) of FIG. 9) to carry out the thermocompression bonding and the heat-releasing member (This phenomenon can also be caused in a heating process such as a process of curing resin which is carried out after resin sealing). Therefore, how the extension of the heat-releasing member 7 occurs varies in many ways. Accordingly, the position and shape of the slits 8 for preventing the extension also vary in many ways.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

The embodiment and concrete examples of implementation discussed in the foregoing detailed explanation serve solely to illustrate the technical details of the present invention, which should not be narrowly interpreted within the limits of such embodiment and concrete examples, but rather may be applied in many variations within the spirit of the present invention, provided such variations do not exceed the scope of the patent claims set forth below.

Industrial Applicability

A COF of the present invention is improved in its flexibility despite of the provision of a heat-releasing member on its back side so that a failure such as a break of a line is prevented. Therefore, the COF is suitably applicable to COFs for providing various semiconductor elements to devices.

REFERENCE SIGNS LIST

1 Insulating film
2 Line
4 Semiconductor element
7 Heat-releasing member
8 Slit
10 and 10a COF (semiconductor element)
30 Display apparatus
Area 1 Area (first area)
Area 2 Area (second area)
Area 3 Area (third area)
Area 4 Area (fourth area)
O1 Opening (first opening)
O2 Opening (second opening)
N Cutout

The invention claimed is:

1. A semiconductor device comprising:
an insulating film;
a line being provided on one side of the insulating film, the line having a terminal for external connection and a terminal for connection to a semiconductor element; and
a heat-releasing member being provided on the other side of the insulating film,
the semiconductor element being joined to the terminal for connection to a semiconductor element,
a first area of the heat-releasing member which first area positionally corresponds to the semiconductor element and a vicinity thereof being greater in its volume per unit area than a second area of the heat-releasing member which second area positionally corresponds to a vicinity of an edge of the heat-releasing member, and
the second area encompassing a third area adjacent to the first area and a fourth area adjacent to the third area and to the edge of the heat-releasing member, the third area being greater in its volume per unit area than the fourth area.

2. The semiconductor device as set forth in claim 1, wherein the heat-releasing member has a slit.

3. A semiconductor device comprising:
an insulating film;
a line being provided on one side of the insulating film, the line having a terminal for external connection and a terminal for connection to a semiconductor element; and
a heat-releasing member being provided on the other side of the insulating film,
the semiconductor element being joined to the terminal for connection to a semiconductor element,
a first area of the heat-releasing member which first area positionally corresponds to the semiconductor element and a vicinity thereof being greater in its area per unit length than a second area of the heat-releasing member which second area positionally corresponds to a vicinity of an edge of the heat-releasing member, and
the second area encompassing a third area adjacent to the first area and a fourth area adjacent to the third area and to the edge of the heat-releasing member, the third area being greater in its area per unit length than the fourth area.

4. The semiconductor device as set forth in claim 3, wherein:
the second area has a plurality of openings which penetrate the heat-releasing member so as to reach the insulating film;
the first area has no opening which penetrate the heat-releasing member so as to reach the insulating film;
the plurality of openings include a plurality of first openings and a plurality of second openings;
each of the plurality of first openings is smaller in its area than each of the plurality of second openings;
the plurality of first openings are provided in the third area; and
the plurality of second openings are provided in the fourth area.

5. The semiconductor device as set forth in claim 4, wherein each of the plurality of openings has no angle of not more than 90°.

6. The semiconductor device as set forth in claim 5, wherein each of the plurality of openings has a circular shape or a polygonal shape having more than five angles.

7. The semiconductor device as set forth in claim 3, wherein:
the second area has a plurality of openings which penetrate the heat-releasing member so as to reach the insulating film;
the first area has no opening which penetrate the heat-releasing member so as to reach the insulating film;
the plurality of openings include a plurality of first openings; and
the number of the plurality of first openings is greater in the fourth area than in the third area.

8. The semiconductor device as set forth in claim 7, wherein each of the plurality of openings has no angle of not more than 90°.

9. The semiconductor device as set forth in claim 8, wherein each of the plurality of openings has a circular shape or a polygonal shape having more than five angles.

10. The semiconductor device as set forth in claim 3, wherein:
the second area has a plurality of cutouts so that an area per unit length of the heat-releasing member in the second area decreases toward the edge of the heat-releasing member; and
the first area does not have the plurality of cutouts.

11. The semiconductor device as set forth in claim 10, wherein the plurality of cutouts are provided in the second area except its part corresponding to a central part of the edge of the heat-releasing member.

12. The semiconductor device as set forth in claim 10, wherein the plurality of cutouts are provided in a part of the second area which part corresponds to a central part of the edge of the heat-releasing member.

13. A display apparatus comprising a display apparatus driving module for driving a display apparatus, the display apparatus driving module being provided in the display apparatus by provision of a semiconductor device, the semiconductor device including:

an insulating film;

a line being provided on one side of the insulating film, the line having a terminal for external connection and a terminal for connection to a semiconductor element; and a heat-releasing member being provided on the other side of the insulating film, the semiconductor element being joined to the terminal for connection to a semiconductor element, a first area of the heat-releasing member which first area positionally corresponds to the semiconductor element and a vicinity thereof being greater in its volume per unit area than a second area of the heat-releasing member which second area positionally corresponds to a vicinity of an edge of the heat-releasing member, and the second area encompassing a third area adjacent to the first area and a fourth area adjacent to the third area and to the edge of the heat-releasing member, the third area being greater in its volume per unit area than the fourth area.

* * * * *

UNITED STATES PATENT AND TRADEMARK OFFICE
CERTIFICATE OF CORRECTION

PATENT NO. : 8,344,486 B2  
APPLICATION NO. : 12/737431  
DATED : January 1, 2013  
INVENTOR(S) : Tomokatsu Nakagawa et al.

Page 1 of 1

It is certified that error appears in the above-identified patent and that said Letters Patent is hereby corrected as shown below:

Title Page should read:

(75) Inventor: Tomokatsu Nakagawa, Osaka (JP); Yasunori Chikawa, Osaka (JP); Akiteru Rai, Osaka (JP); Tatsuya Katoh, Osaka (JP); Takuya Sugiyama, Osaka (JP)

Signed and Sealed this  
Twenty-sixth Day of March, 2013

Teresa Stanek Rea  
*Acting Director of the United States Patent and Trademark Office*